(12) United States Patent
Mendivil

(10) Patent No.: US 12,320,834 B2
(45) Date of Patent: Jun. 3, 2025

(54) REAL-TIME FAULT DETECTION AND INFRARED INSPECTION SYSTEM

(71) Applicant: Darryl Mendivil, San Luis Obispo, CA (US)

(72) Inventor: Darryl Mendivil, San Luis Obispo, CA (US)

(*) Notice: Subject to any disclaimer, the term of this patent is extended or adjusted under 35 U.S.C. 154(b) by 0 days.

(21) Appl. No.: 17/173,144

(22) Filed: Feb. 10, 2021

(65) Prior Publication Data

US 2021/0247436 A1 Aug. 12, 2021

Related U.S. Application Data

(60) Provisional application No. 62/972,640, filed on Feb. 10, 2020.

(51) Int. Cl.
| | | |
|---|---|---|
| G01R 31/08 | (2020.01) |
| G08B 21/18 | (2006.01) |
| H04N 5/262 | (2006.01) |
| H04N 5/272 | (2006.01) |
| H04N 7/18 | (2006.01) |
| H04N 23/45 | (2023.01) |
| H04N 23/51 | (2023.01) |
| H04N 23/52 | (2023.01) |
| H04N 23/54 | (2023.01) |
| H04N 23/66 | (2023.01) |
| H04N 23/90 | (2023.01) |

(52) U.S. Cl.
CPC ......... *G01R 31/085* (2013.01); *G01R 31/088* (2013.01); *G08B 21/182* (2013.01); *H04N 5/2624* (2013.01); *H04N 5/272* (2013.01); *H04N 7/181* (2013.01); *H04N 23/45* (2023.01); *H04N 23/51* (2023.01); *H04N 23/52* (2023.01); *H04N 23/54* (2023.01); *H04N 23/66* (2023.01); *H04N 23/90* (2023.01)

(58) Field of Classification Search
CPC .............. G01R 31/085; G01R 31/088; H04N 5/22521; H04N 5/2252; H04N 5/2253; H04N 5/2258; H04N 5/23203; H04N 5/247; H04N 5/2624; H04N 5/272; H04N 7/181; G08B 21/182
USPC ........................................................ 348/125
See application file for complete search history.

(56) References Cited

U.S. PATENT DOCUMENTS

| | | | |
|---|---|---|---|
| 6,335,722 B1 * | 1/2002 | Tani | G06F 3/0481 |
| | | | 348/208.1 |
| 9,325,366 B1 * | 4/2016 | Zhou | H04B 1/3888 |

(Continued)

OTHER PUBLICATIONS

FLIR Motion Control Systems Model PTU-D48 E Series Configuration Guide, Mar. 2013, Burlingame, CA, USA.

*Primary Examiner* — Matthew David Kim
(74) *Attorney, Agent, or Firm* — Gary L. Eastman, Esq.; Eastman IP

(57) ABSTRACT

A Real-Time Fault Detection and Infrared Inspection System includes a fixed imaging system that includes a visual imaging device paired with an infrared imaging device which together can provide both visual and heat-detecting monitoring of anything within its field of view. The fixed imaging system is mounted to the top of a transmission tower and directed to view the transmission lines leading to and from the tower such that an operator can remotely access the imaging devices to visually inspect and to infrared inspect the system, checking for physical damage as well as excessive heat areas.

11 Claims, 15 Drawing Sheets

(56) References Cited

U.S. PATENT DOCUMENTS

| | | | |
|---|---|---|---|
| 10,244,190 B2* | 3/2019 | Boulanger | G06T 5/70 |
| 10,775,683 B1* | 9/2020 | Hallett | F16M 11/24 |
| 11,012,601 B1* | 5/2021 | Yue | H04N 23/57 |
| 2008/0259161 A1* | 10/2008 | Hellman | H04N 7/185 |
| | | | 348/148 |
| 2009/0002548 A1* | 1/2009 | Liang | H04N 1/00559 |
| | | | 396/428 |
| 2009/0196593 A1* | 8/2009 | Cheng | G03B 17/00 |
| | | | 396/155 |
| 2012/0320150 A1* | 12/2012 | Montgomery | H04N 23/698 |
| | | | 348/E5.025 |
| 2013/0038728 A1* | 2/2013 | Kim | H04N 23/56 |
| | | | 348/143 |
| 2014/0063334 A1* | 3/2014 | McBride | H04N 23/51 |
| | | | 348/373 |
| 2014/0176555 A1* | 6/2014 | Kuo | G06T 11/206 |
| | | | 345/440 |
| 2015/0304532 A1* | 10/2015 | Bart | H04N 23/695 |
| | | | 901/9 |
| 2015/0304612 A1* | 10/2015 | Richards | H04N 7/188 |
| | | | 348/159 |
| 2015/0362172 A1* | 12/2015 | Gabriel | F21V 11/16 |
| | | | 348/151 |
| 2016/0147209 A1* | 5/2016 | Stoupis | H02J 13/00034 |
| | | | 700/295 |
| 2016/0323522 A1* | 11/2016 | Heinke | H04N 5/23293 |
| 2017/0124885 A1* | 5/2017 | Patterson | G08G 5/0069 |
| 2018/0157250 A1* | 6/2018 | Barnickel | G05D 1/0077 |
| 2018/0302566 A1* | 10/2018 | Wada | H04N 23/55 |
| 2019/0236922 A1* | 8/2019 | Lee | G08B 25/10 |

* cited by examiner

REAL-TIME FAULT DETECTION AND INFRARED INSPECTION SYSTEM

PRIOR APPLICATIONS

This application claims the benefit of priority to U.S. Provisional Patent Application Ser. No. 62/972,640 entitled REAL-TIME FAULT DETECTION AND INFRARED IMAGING SYSTEM, with a filing date of Feb. 10, 2020, and the entirety of which is hereby incorporated by this reference.

FIELD OF THE INVENTION

The present invention relates generally to fault detection systems. The present invention is more particularly related to the identification and classification of fault detection in high voltage electrical transmission lines exhibiting higher than normal operating temperatures or point failures. The present invention is well suited for the real-time monitoring of high voltage transmission lines using fixed and portable imaging systems to accurately and efficiently identify conditions that can lead to fire, system failure or other undesired system conditions.

BACKGROUND OF THE INVENTION

In modern times, the world operates on electricity. Generally, the electricity that is used throughout the world is generated in more localized generation areas, such as steam generation plans, hydroelectric dams, solar farms, wind generation turbines, or a traditional coal powered power generation system. Regards of what type of system is used to generate the electricity, the generation location is seldom adjacent the area of consumption. As a result, there is a need in the world where electricity generated in one location, is transmitted to other areas needing the electricity. Oftentimes this electricity is transmitted using overhead wires which are generally high voltage in the tens of thousands of volts, and which can span hundreds if not thousands of miles. Indeed, electricity generated in one country is often transmitted to other countries having a need.

The typical method by which high voltage electricity is transmitted across the globe includes a high voltage electrical transmission line where those lines are suspended high above the earth and often consist of many individual conductors which each carry an electrical voltage and in combination can deliver a voltage to a destination, such as a localized distribution center. These localized distribution centers are often placed where the power is ultimately needed, such as in municipalities, neighborhoods, manufacturing facilities and the like.

Since these high voltage electrical transmission lines span hundreds if not thousands of miles, it is common for these lines to be located in remote areas where easy access for inspection and maintenance is not available. In these areas, the transmission lines are often left uninspected, and only when a system fault occurs do inspection personnel actually visit and inspect the area. Unfortunately, these system faults can occur due to corrosion, stretching of the lines, insulator degradation, high seasonal temperatures, damaging winds, or a host of other challenges inherent in high voltage transmission of electricity. With these faults come the possibility that the fault will result in fires being started either on the transmission line, on the supporting electrical tower structures, or in some cases, in the neighboring vegetation. The neighboring vegetation fires often cause the most damage. For instance, when a fault occurs in a remote location, such as in a heavily forested mountain region, the fault can ignite neighboring vegetation, and that fire being in a remote and generally inaccessible region, may go on for some time before being detected. Unfortunately, this delay can and does result in the loss of enormous forest areas, loss of countless properties in rural areas, and most unfortunately, the loss of wildlife and human life due to the unexpected and uncontrolled wildfire.

In light of the above, it would be advantageous to provide a real-time monitoring system that enables the organizations monitoring high voltage transmission lines, such as municipalities or energy companies, to maintain inspection of all locations of an electrical distribution network to provide immediate notification of pre-fault conditions such that organization may assess the risk prior to a fault condition occurring and the triggering of the negative consequences outlined above. It would also be advantageous to provide a system that is easily installed, easily maintained, easily operated, and relatively cost effective. It would also be advantageous to provide both fixed and portable solutions to accommodate those high voltage transmission line installations which are both accessible, and inaccessible to the maintenance and monitoring crews.

SUMMARY OF THE INVENTION

The Real-Time Fault Detection and Infrared Inspection System of the present invention includes a fixed imaging system that includes a visual imaging device paired with an infrared imaging device which together can provide both visual and heat-detecting monitoring of anything within its field of view. In a preferred embodiment, this fixed imaging system is mounted to the top of a transmission tower and directed to view the transmission lines leading to and from the tower such that an operator can remotely access the imaging devices to visually inspect and to infrared inspect the system, checking for physical damage as well as excessive heat areas.

Typically, when an electrical transmission line is experiencing early failures, such as corrosion, stretching, or physical damage, that area adjacent the damage becomes hotter than the adjacent components of the system. For instance, when a splice (junction between two ends of a transmission cable) begins to corrode and fail, the electrical resistance of splice increases. Since the resistance increases, the current through that resistance causes an increase in the heat at that splice location as compared to the transmission line itself. In significant circumstances, this heat can cause the splice to melt, catch fire, or otherwise catastrophically fail which can result in a live transmission line falling to the ground igniting its surroundings. In other circumstances, the failure is explosive in nature, and the sparks ignite the surroundings.

The Real-Time Fault Detection and Infrared Inspection System of the present invention monitors every location of an electrical transmission system, and detects these faults through the presetting of fault conditions. These preset fault conditions are triggered when an area under surveillance passes a preset threshold for infrared heat, and warnings are automatically sounded to provide the operators immediate notice of a fault condition, thus providing an emergency response to either shut the system down, summon repair crews, notify local residents, or bypass a trouble location. Regardless of the action taken, the operator is in full control with immediate information of a fault condition before it escalates to something catastrophic.

In addition to the fixed imaging system, the Real-Time Fault Detection and Infrared Inspection System of the present invention includes both vehicle mounted detection systems, as well as hand-operated systems. These vehicle and hand systems cooperate with the fixed systems to provide an operator the ability to inspect an entire electrical transmission and distribution system easily and routinely.

Each of the imaging systems of the Real-Time Fault Detection and Infrared Inspection System of the present invention includes the ability to access and report a global positioning satellite (GPS) location which, when coupled with the visual image of the area experiencing a fault, and the infrared image of the heat profile, provides the operator with a pinpoint location of the fault, and visual appearance of the fault location, and a heat index image of the fault condition giving rise to the severity of the fault, and the associated risk of catastrophic failure or fire. The Real-Time Fault Detection and Infrared Inspection System of the present invention provides operators a system to effectively monitor every inch of a distribution network, and thereby significantly limit the risk of catastrophic failures due to damage or maintenance-related faults.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DETAILED DESCRIPTION

Figure 1:
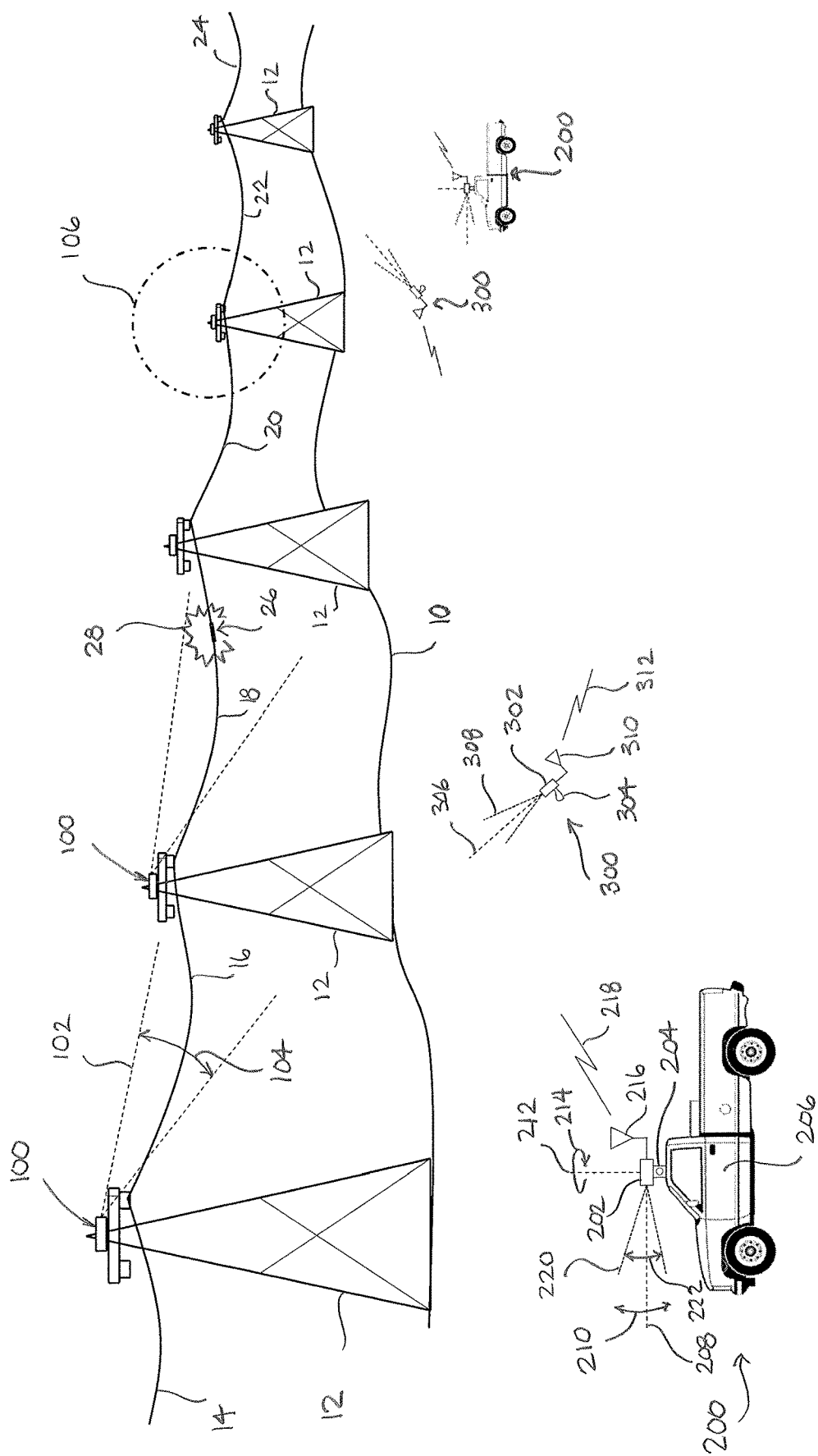
FIG. 1 is a system-level drawing showing a typical high voltage electrical transmission line spanning between numerous transmission line towers in a rural area each equipped with the fixed imaging system of the present invention, and a few vehicle and hand-held imaging systems which together provide a system wide monitoring system for high voltage electrical transmission.

Referring initially to FIG. 1 a system-level drawing is shown and includes a typical high voltage electrical transmission line 14, 16, 18, 20, 22, 24 spanning between numerous transmission line towers 12 in a rural area 10 each equipped with the fixed imaging system 100 of the Real-Time Fault Detection and Infrared Inspection System of the present invention. Also in this Figure, a few vehicle 200 and hand-held 300 imaging systems are shown which together provide a system wide monitoring system for high voltage electrical transmission.

Fixed imaging system 100 has a field of view 102 with an angle 104 which, through lensing, can be selected for a particular application. For instance, when the separation between towers 12 is small (such as 100 yards), the angle 104 can be wide providing for a larger field of view. Alternatively, when the separation between towers 12 is large (such as 500 yards), the angle 104 can be narrow to view only the transmission line. In some applications, a varying focal lens may be used to provide a variable angle 104 to provide both wide angle viewing, and a more narrowed view, such as when zooming in on a possible fault location.

From this view, it is to be appreciated that a fault condition can occur. For instance, a splice 26 is depicted and, in a fault condition, exhibits a heat signature 28 which emits an infrared signal that is detected by the fixed imaging system 100. A more detailed description of the imaging system 100 follows below.

Vehicle mounted imaging system 200 includes an imaging device 202 mounted to a PTZ system 204 attached to a vehicle 206, and has a beam direction 208 that can be raised or lowered in direction 210. Likewise, imaging device 202 can be rotated about vertical axis 212 in direction 214 as needed to pan to a desired field of view 220. An antenna 216 is provided to allow radio communication 218 with a central command center, and the field of view 220 of the imaging device 202 can be adjusted 222. The vehicle mounted imaging system 200 can be driven through a transmission system, and the imaging device 202 can be panned left to right, and raised or lowered to obtain the best image possible of the transmission line system components.

Portable imaging system 300 includes an imaging device 302 having a handle 304 which has an imaging direction 306 and a field of view 308 such that a user can manually direct the imaging device 302 at transmission line system components to assess a possible fault condition. In the event a fault condition occurs, the imaging device 302 can use antenna 310 to communicate wirelessly 312 to a central command center.

Figure 2:
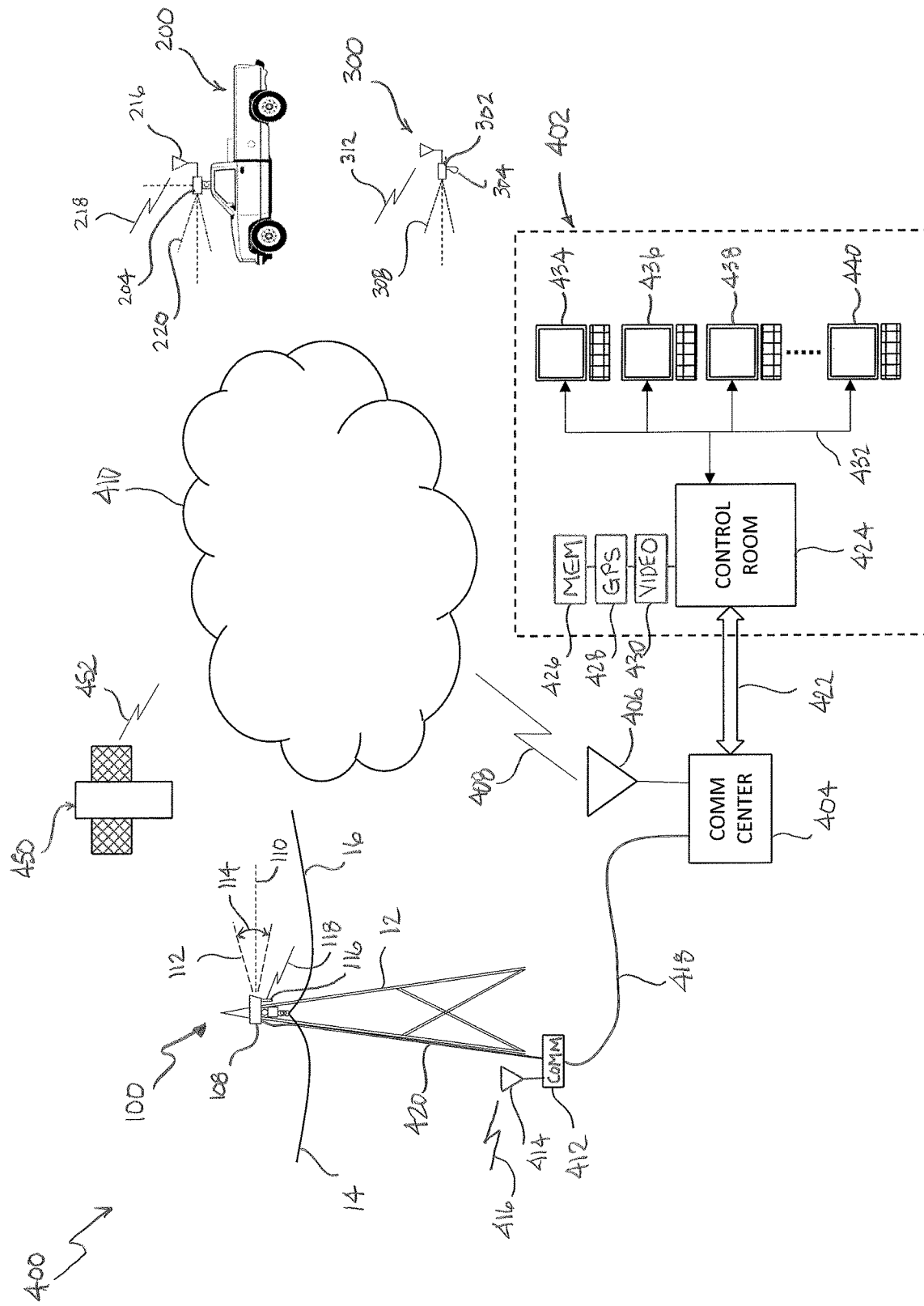
FIG. 2 is a system level drawing showing a single transmission line tower having a fixed imaging system looking downline and equipped with a communication link that can by wired or wireless connection, communicate to a communication center that interfaces with the digital cloud, a vehicle imaging system and a handheld imaging system that can likewise communicate to a communication center and is configured to receive GPS data, and provide all communications bidirectionally to a control center having a number of remote monitoring stations through which operational personnel can monitor real time data of the electrical transmission lines being monitored.

Referring now to FIG. 2, a Real-Time Fault Detection and Infrared Inspection System of the present invention is shown and generally designated 400. System 400 includes a single transmission line tower 12 supporting transmission lines 14 and 16, and is equipped with a fixed imaging system 100 looking downline. As shown, fixed imaging system 100 includes an imaging device 108 has a direction of view 110 with an image field 112 with a specific view angle 114. As described above, this view angle 114 can be pre-set in the form of a fixed lens, or it can be dynamic in the form of an adjustable focal length lens that will allow the broad view as well as a narrow view for component view or fault detection. Additionally, this imaging device 108 may be equipped with a PTZ component which allows the imaging 108 device to rotate in 360 degrees, pan and tilt upwards or downwards to allow a thorough inspection of all adjacent components of an electrical transmission line system.

A communication link is provided through a wired connection 420, or with antenna 116 through a wireless connection 118, and can communicate to a communication center 412 that interfaces through antenna 414 wirelessly via communications link 416 with the digital cloud 410. A vehicle imaging system 200 and a handheld imaging system 300 can likewise communication to a communication center 404 through antenna 406 or though other communication means known in the art. Communication from fixed imaging system 100 can also be routed via direct wiring 418 to a communication center 404, such as through routing over cabling also suspended from the transmission towers. Communication center 404 is configured to receive GPS data 452 from a GPS network 450. As a result of the GPS receivers being present in each imaging device, it is possible to know the exact time, location and direction of travel of each imaging device of the system 400. The exact time, location and direction of travel of each imaging device of the system 400 can be communicated through link 408 and facilitates the immediate and pinpoint location of any fault detected, and minimizes the time delay in detection and resolution of faults, thereby minimizing the effects of a fault.

Each imaging device 100, 200, 300 of the Real-Time Fault Detection and Infrared Inspection System of the present invention communicates bidirectionally through communication link 422 to a control center 402 having a number of remote monitoring stations 434, 436, 438, 440 through which operational personnel can monitor real time data of the electrical transmission lines being monitored. As shown, control room 424 is equipped with system memory 426, a GPS interface 428, and a video storage and analysis module 430 which receives both visual and infrared video data for storage and analysis.

Figure 3:
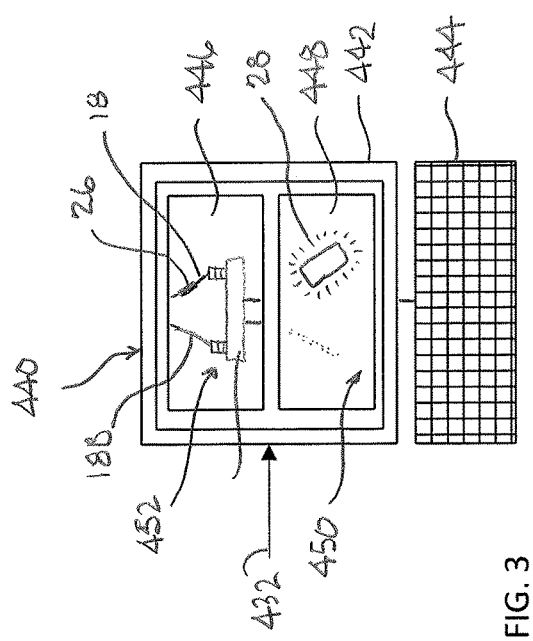
FIG. 3 is a representative example of a monitoring station of the Real-Time Fault Detection and Infrared Inspection System of the present invention and can be configured to display both a visual image field, and an infrared image field.
Figure 4:
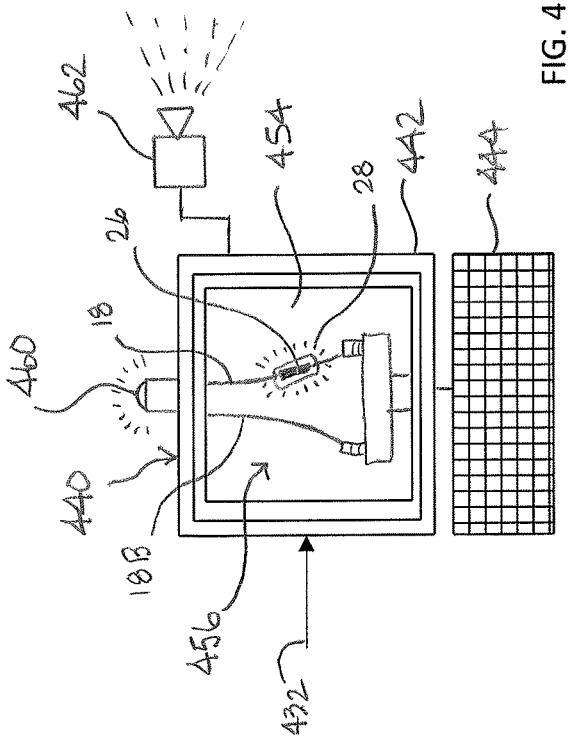
FIG. 4 is an alternative representative example of a monitoring station of the Real-Time Fault Detection and Infrared Inspection System of the present invention showing the superposition of the visual image field over the infrared image field to provide an operator with a clear indication of the location and source of a possible fault condition.

FIG. 3 is a representative example of a monitoring station 440 of the Real-Time Fault Detection and Infrared Inspection System of the present invention 400 having monitor 442 and a user interface 444. Monitoring stations, such as station 440 receives input from control room on communication link 432 and can be configured to display both a visual image field 446, and an infrared image field 448. As shown in image 452 of visual image field 446, a typical transmission tower support with insulators and a pair of electrical transmission lines 18 and 18B are shown leaving the conductor and having a splice 26. A corresponding infrared image field 448 is shown and depicts a high heat signature 28 in image 450. However, the infrared image alone is not always sufficient to identify the source of the heat. Accordingly, FIG. 4 is an alternative representative example of a monitoring station 440 of the Real-Time Fault Detection and Infrared Inspection System of the present invention 400 configured to show the superposition of the visual image field 446 over the infrared image field 448 to provide an operator with a clear indication of the location and source of a possible fault condition. Specifically, the visual image 452 is combined with the infrared image 450 to provide a combined image 456 that allows an operator to both see the visual image 452, and the heat signature 28, to pinpoint the failure in the visual field 454. For instance, in this exemplary image, the heat signature 28 is clearly associated with splice 26 giving the operator a confirmation that the splice is the fault location. If a heat signature 28 measured using the infrared imaging system exceeds a preset level, an audio alarm 462 and a visual alarm 460 can be triggered in order to alert the operational personnel of a fault condition and need for immediate action.

Figure 5:
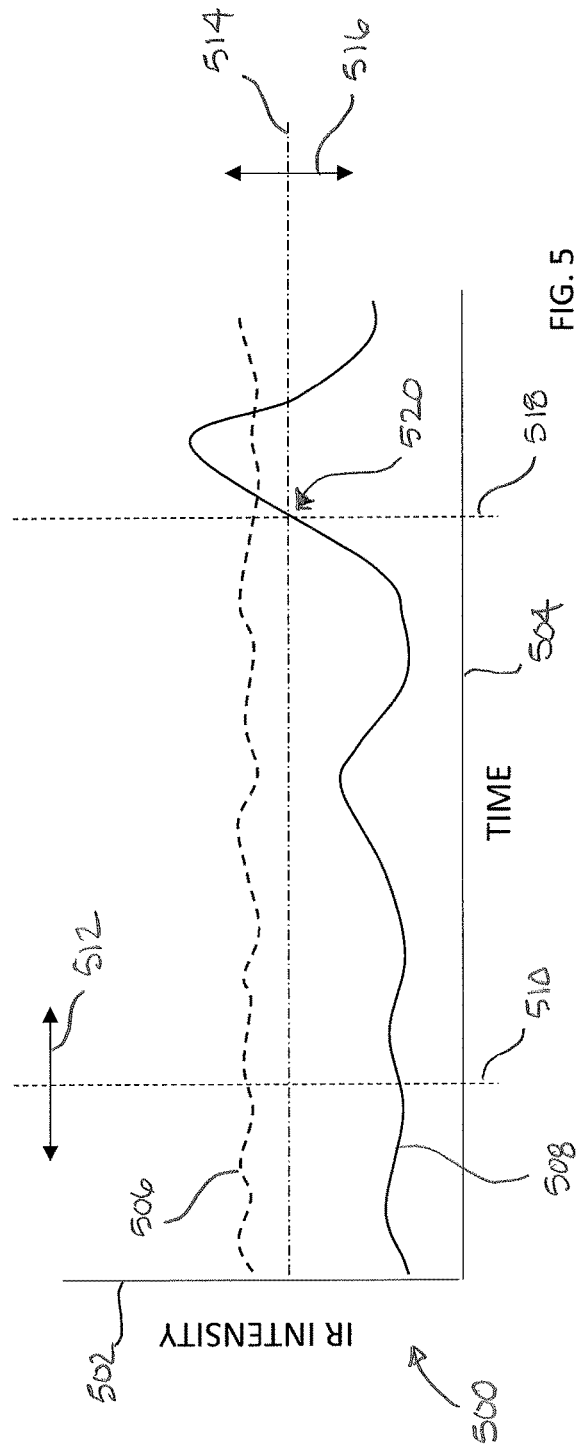
FIG. 5 is a graphical representation of the video image data and an infrared image data depicting the detection of a fault condition when the intensity of the infrared video signal passes a preset threshold, and provision of an alarm condition to the operator to take immediate action once the fault is detected.

FIG. 5 is a representation of a graph 500 having an infrared intensity 502 against time 504 and plotted with the video image data 506 and an infrared image data 508 depicting the detection of a fault condition when the intensity of the infrared video signal 508 passes a preset threshold 514, and provide an alarm condition at instant 520 to the operator to take immediate action once the fault is detected. The infrared threshold limit 514 may be adjusted 516 for use in a variety of applications where the heat level may be acceptably higher or lower. For instance, in a high heat environment and high current, the infrared preset level may be higher, but in colder climates and lower current applications, the preset level may be lower. Time cursor 510 can be advanced through the video as recorded or monitored to provide a system monitor to pan through time 512 in order to focus attention on a particular video segment for analysis and fault detection, such as at time 518 where the infrared threshold limit 514 was exceeded.

Figure 6:
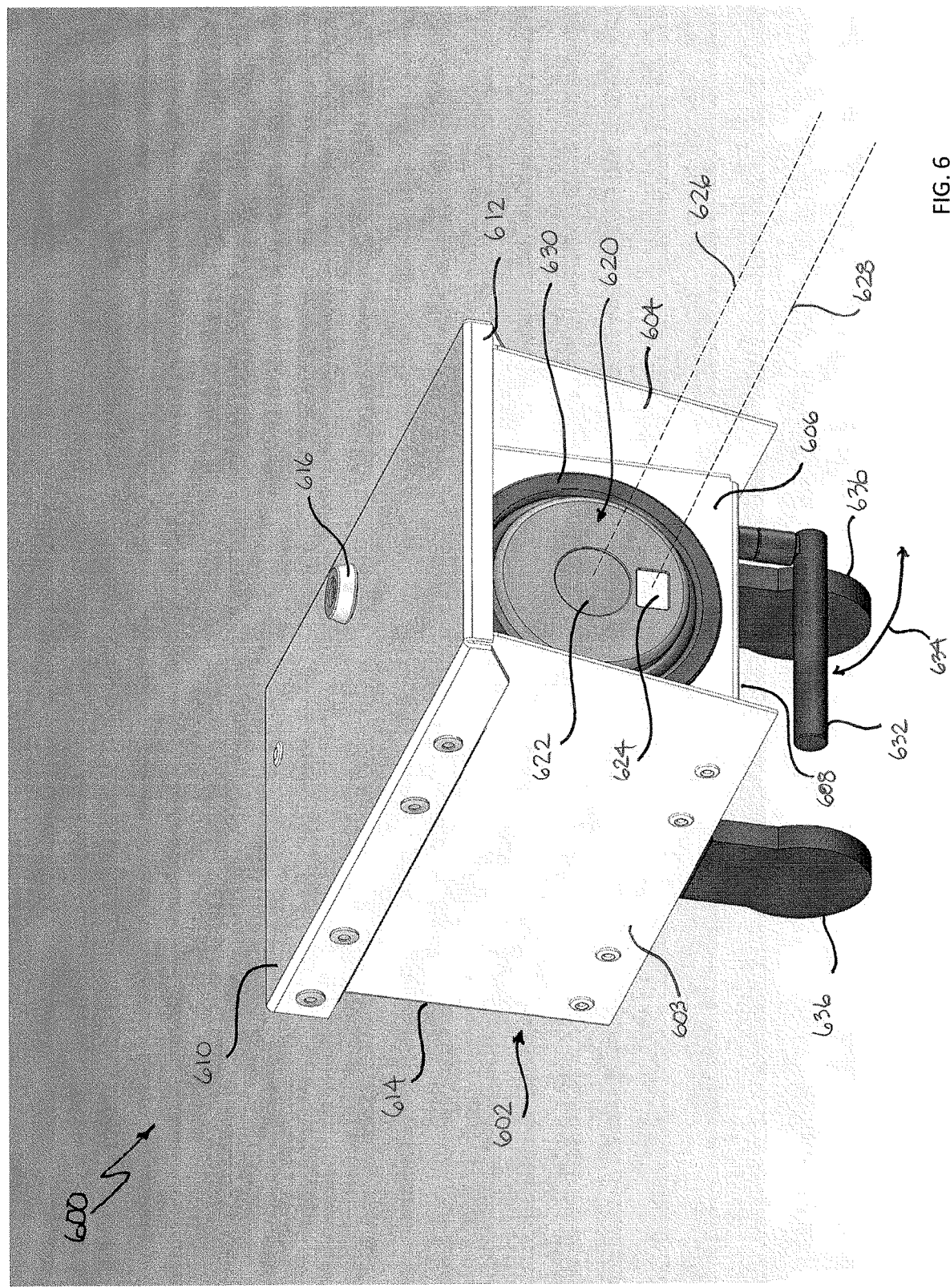
FIG. 6 is a perspective view of the imaging system of the Real-Time Fault Detection and Infrared Inspection System of the present invention showing a rectangular chassis equipped with a dual imaging camera having a visual sensor and an infrared sensor, and equipped with an antenna for transmitting wireless signals, and a mounting base suitable for attachment to a pan, tilt and zoom ("PTZ") base.

Referring now to FIG. 6, a perspective view of a preferred embodiment of the imaging system 600 of the Real-Time Fault Detection and Infrared Inspection System 400 of the present invention is shown. Imaging system 600 includes a rectangular chassis 602 having a left side 603, a right side 604, a front face 606, a bottom 608, a lid 610 having a drip edge 612 and a back 614. This exemplary chassis is not limiting, rather, it is an optimum design that is easily manufactured and durable and highly suitable for the instant imaging system.

Imaging system 600 is equipped with a dual imaging camera 620 having a visual sensor 624 and an infrared sensor 622 having an optical axis 628 and an infrared axis 626 respectively. Imaging system 600 is equipped with an antenna 632 that can be extended 634 for transmitting wireless signals, and a mounting base 636 suitable for attachment to a pan, tilt and zoom ("PTZ") base. Lock 616 allows secure access to the contents of chassis 602.

Figure 7:
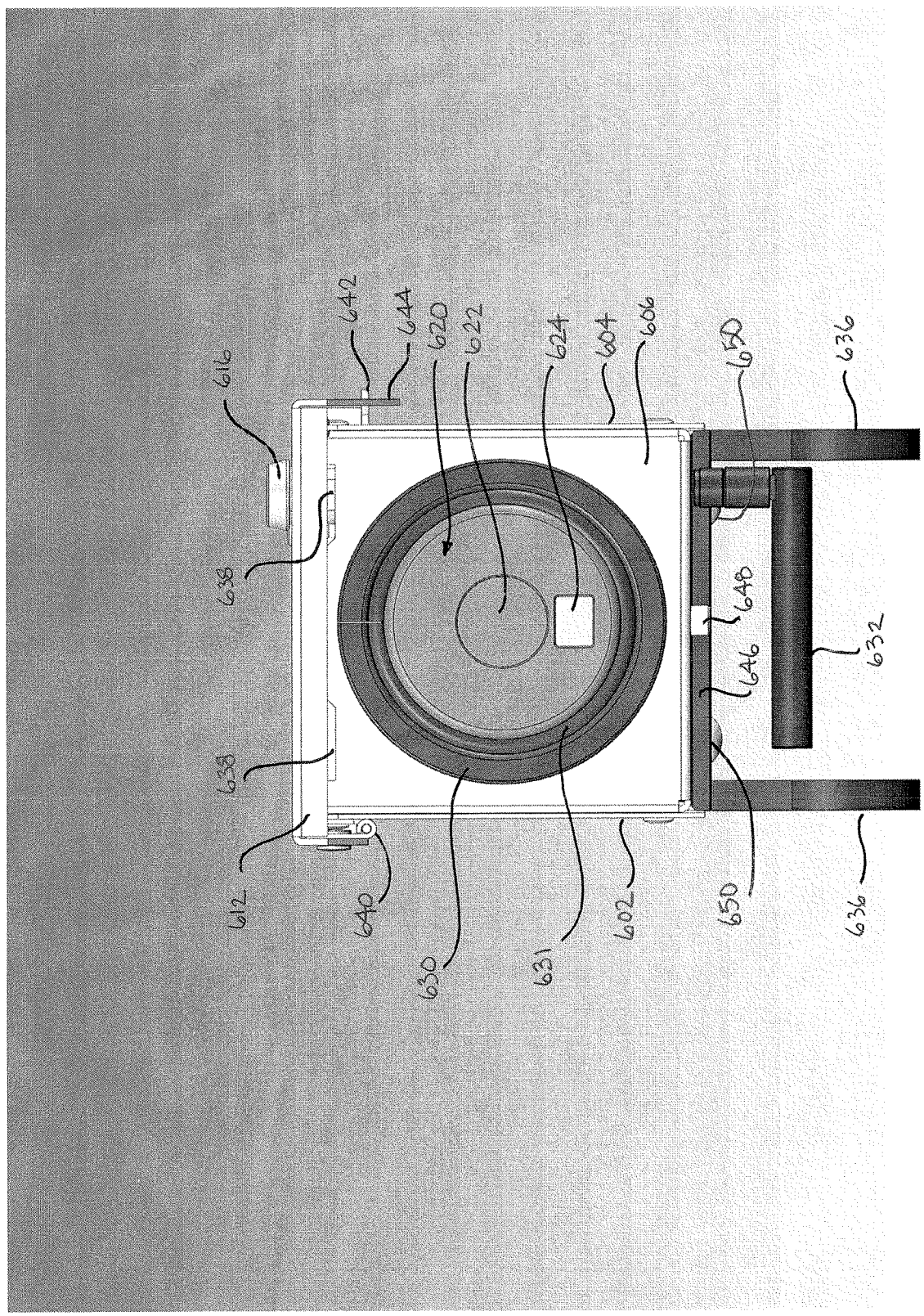
FIG. 7 is a front view of the imaging system of the Real-Time Fault Detection and Infrared Inspection System of the present invention showing the placement of the visual sensor and infrared sensor and surrounding chassis features.

The front view of FIG. 7 shows the imaging system 600 of the Real-Time Fault Detection and Infrared Inspection System 400 of the present invention and the placement of the visual sensor 624 and infrared sensor 622 of camera 620. Also, chassis 602 features include vents 638, hinge 640 to allow opening of chassis 602, and locking tab 642 on flange 644 are shown.

FIG. 7 also shows the mounting of camera 620 in front panel 606 such that the infrared imaging device 624 and visual imaging device 622 are securely mounted to the chassis 602 which is attached to base 646 using attachment screw 648 to mount the camera 620 securely. Additional bolts 650 may be added for added strength of mounting chassis 602 to base 646. A sealing ring 630 is provided with a bellows 631 to provide for the sealed alignment of the camera 620 in chassis 602 while maintaining a clean seal around the camera 620. This provides a seal to prevent movement between the camera and the chassis, while also allowing the easy sealing without particular concern for precise alignment of the camera within the camera aperture formed in the front panel.

Figure 8:
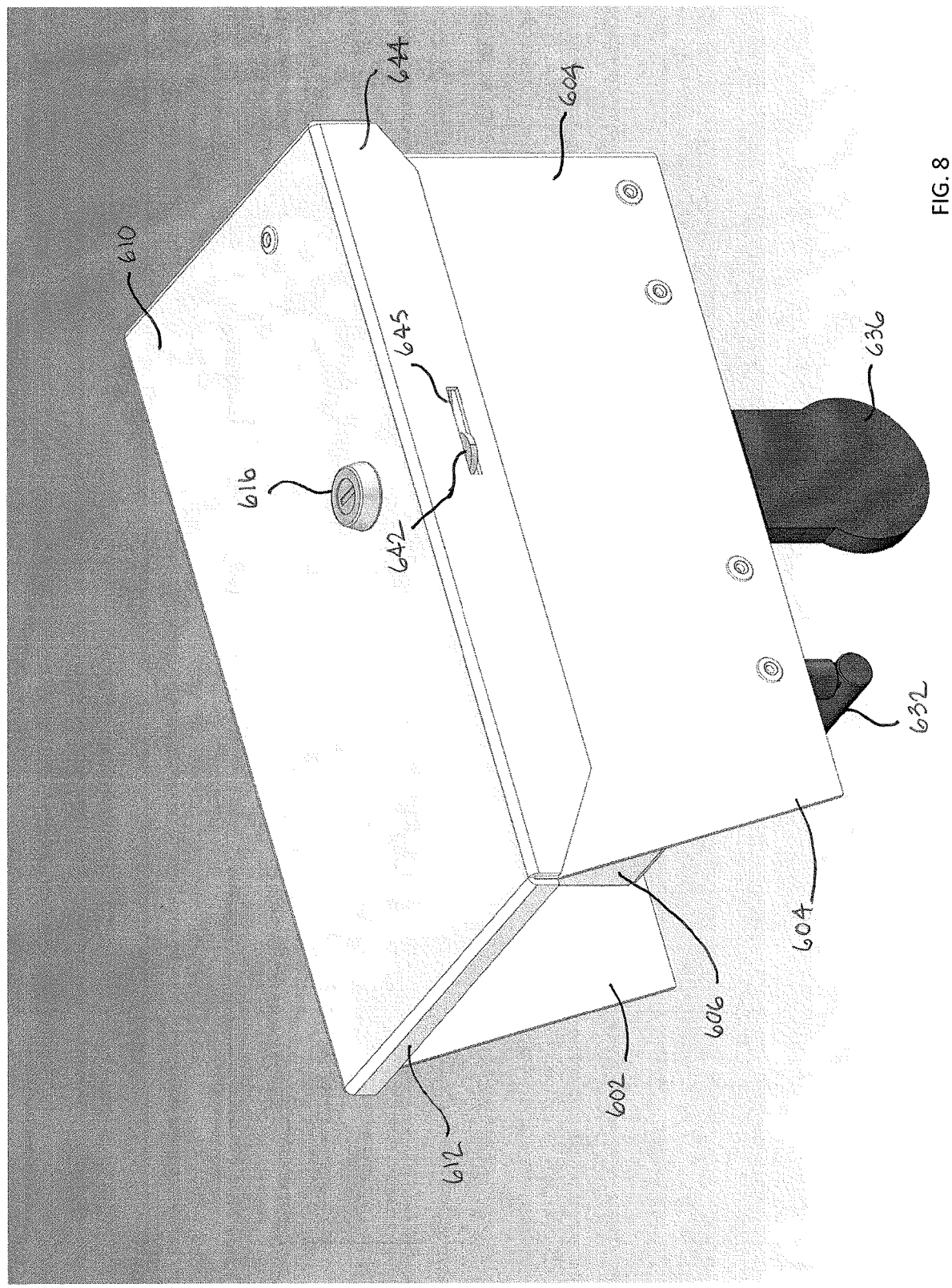
FIG. 8 is a right side perspective view of the imaging system of the Real-Time Fault Detection and Infrared Inspection System of the present invention showing the locking features and PTZ attachment mount.
Figure 9:
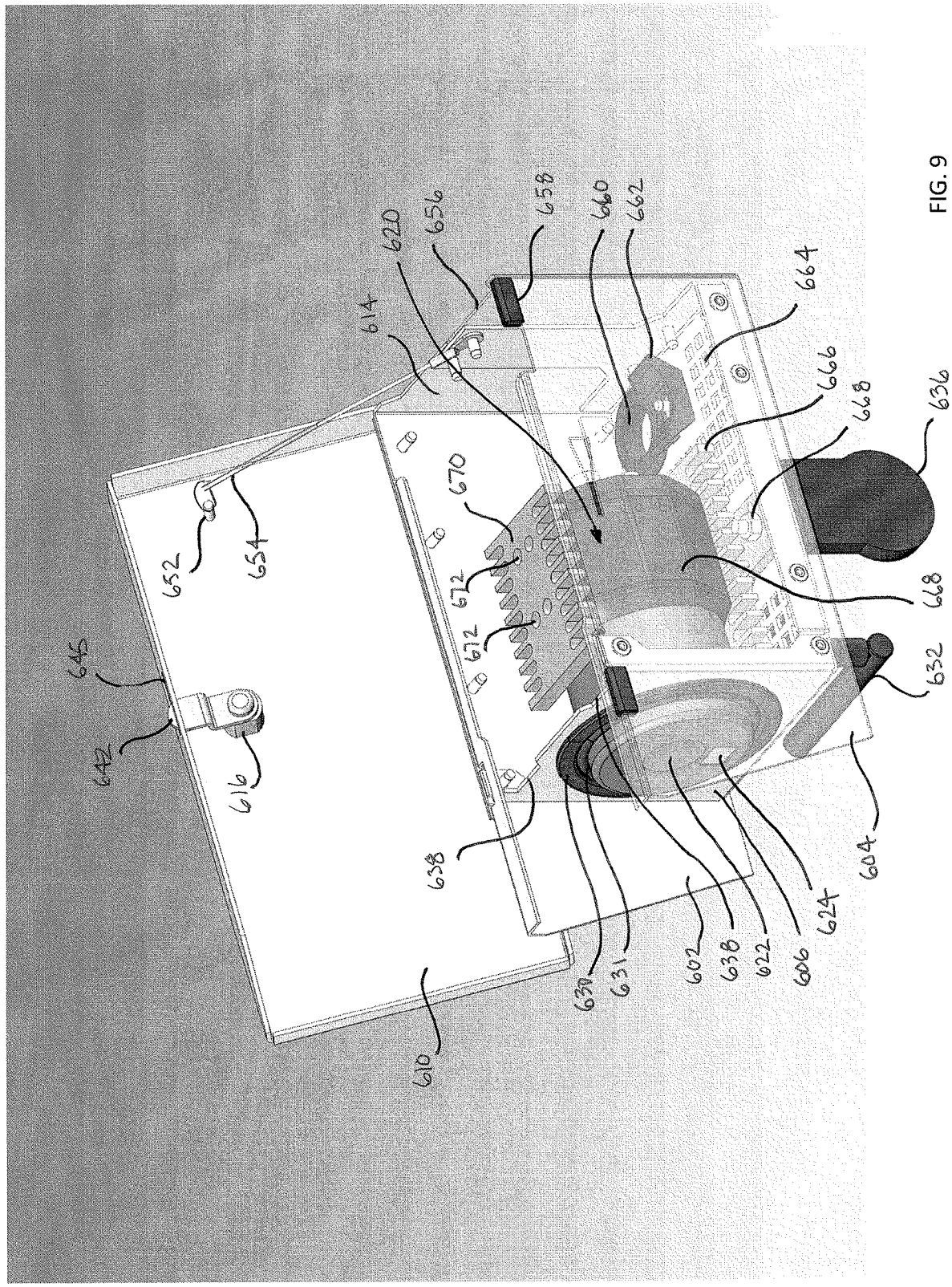
FIG. 9 is a right side view of the imaging system of the Real-Time Fault Detection and Infrared Inspection System of the present invention with a portion of the chassis shown in phantom to allow discussion of the camera and related heat sink configuration, upper and lower venting, and other internal features of the imaging system.
Figure 10:
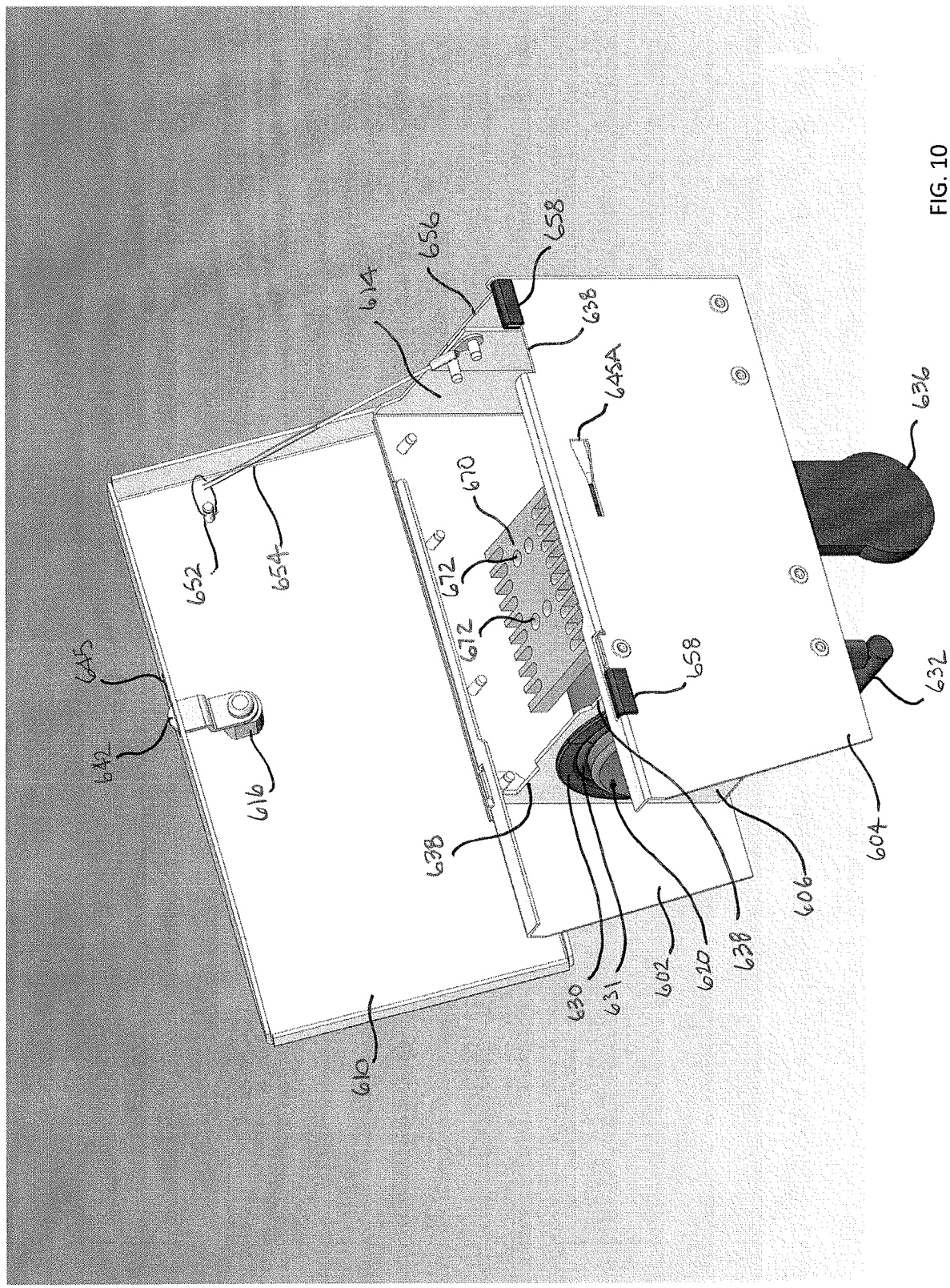
FIG. 10 is a view consistent with FIG. 9, with the phantom portion removed to depict the locking configuration.

FIG. 8 is a right side perspective view of the imaging system 600 of the Real-Time Fault Detection and Infrared Inspection System 400 of the present invention showing the lock 616 with locking tab 642 in slot 645 and PTZ attachment mount 636.

FIGS. 9 through 13 show the internal components of the imaging system 600 of the Real-Time Fault Detection and Infrared Inspection System 400 of the present invention. From this view, camera 620 can be clearly seen and is mounted on its upper and lower surfaces to a heat sink 666 and 670 using mounting fasteners 672. The lower heat sink 666 is attached to the base of chassis 602 using bolts 668 to attach the system 600 to the PTZ mount 636.

To provide for the proper ventilation of the camera 620 and dissipation of heat from heat sinks 666 and 670, vents 656 and 638 are formed in the front wall 606 and back wall 614 of chassis 602. A lid support line 654 extends from the chassis back wall 614 to fastener 652 on lid 610 to support the lid in the open position for maintenance and inspection. A locking slot 645A is formed to receive locking tab 642 when in the closed and locked position. Pads 658 are provided to provide a secure and rattle free enclosure which is particularly useful when operating the device 600 in rugged environments. Wiring aperture 660 and wire tie bracket 662 are provided to all the securing of cables that connect the camera 620 to the remainder of the system described herein. A wire tie can be used to secure a cable bundle to wire tie bracket 662. Additionally, vents 664 are formed in bottom panel of chassis to provide heat ventilation to cool the camera and related components. A bottom bracket 669 provides a base for mounting heat sink 666 using bolts 668 and further to secure camera 620 in place.

Figure 12:
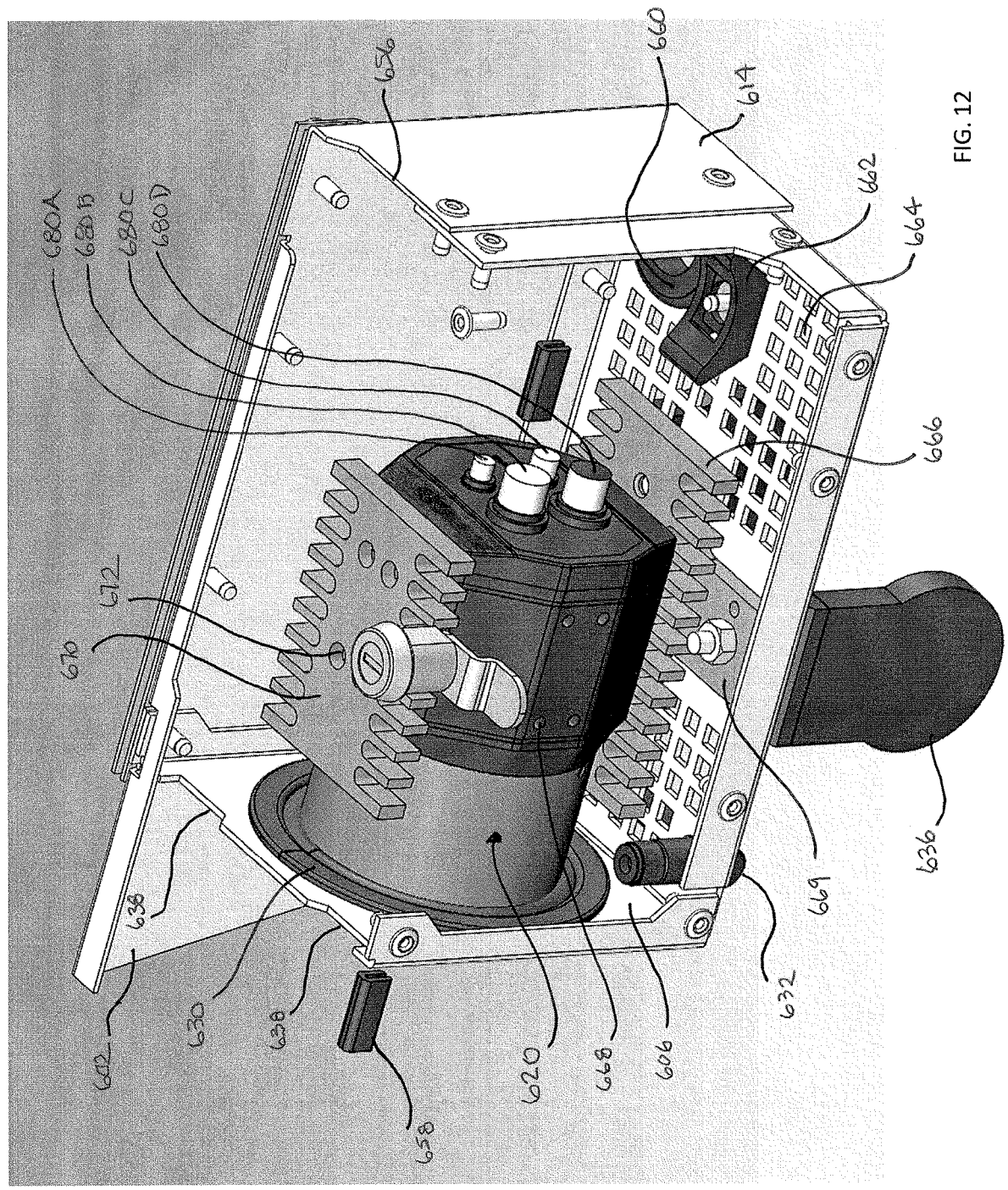
FIG. 12 is an enlarged view of the imaging system of the Real-Time Fault Detection and Infrared Inspection System of the present invention with the lid removed and showing the camera, heat sink configuration and attachment, electrical connections for the camera, cabling fasteners, and camera interface to the front panel of the chassis.
Figure 13:
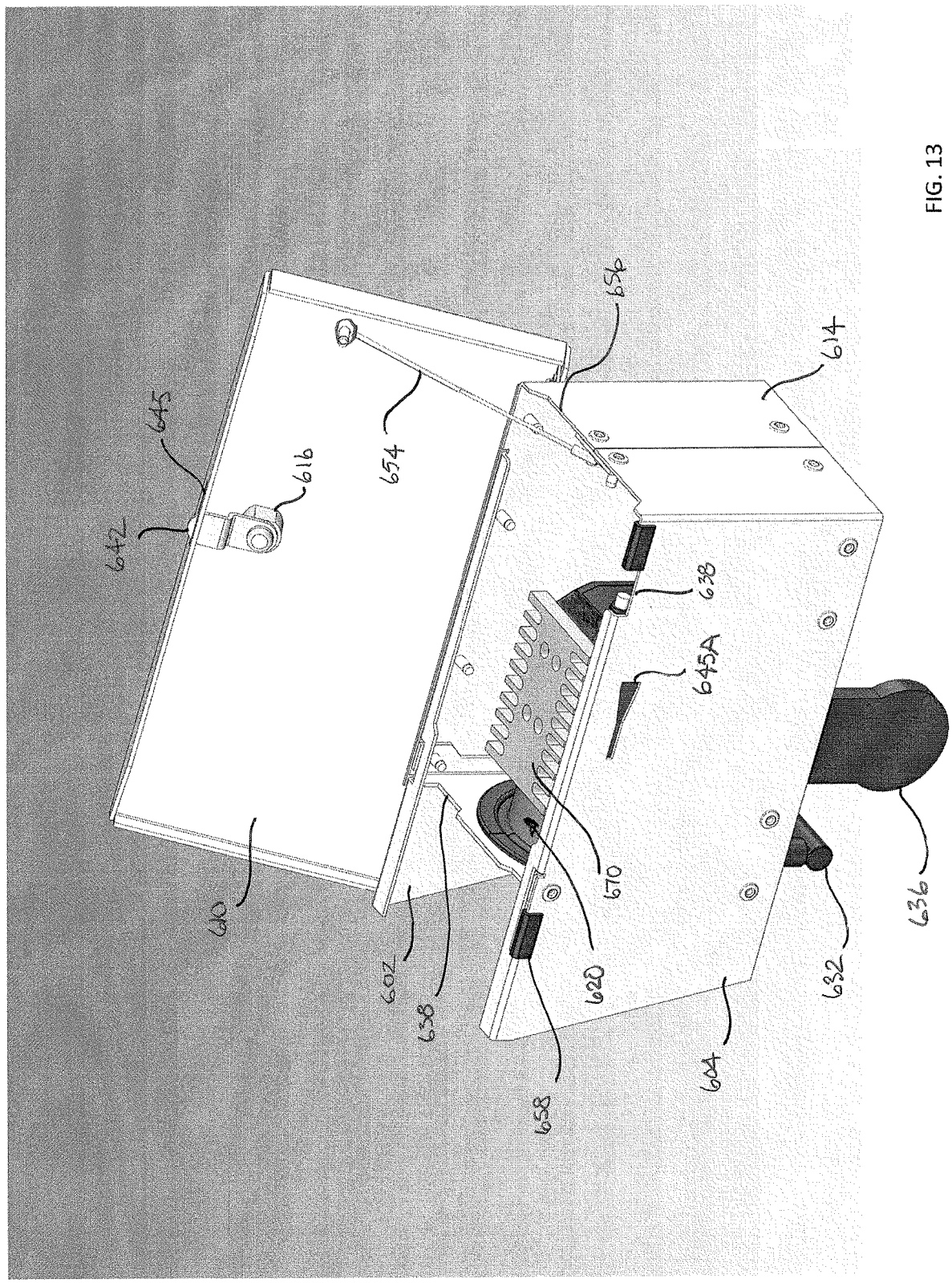
FIG. 13 is a back right side view showing the lid and associated venting formed to create an air passage for the heated air leaving the heat sinks to rise and exit the chassis drawing fresh, cooled air, through the lower vent panel.

FIG. 12 is an enlarged view of the imaging system 600 of the Real-Time Fault Detection and Infrared Inspection System 400 of the present invention with the lid 610 removed and showing the camera 620, heat sink 666 and 670 configuration and attachment, and the various electrical connections for the camera 680A, 680B, 680C, and 680D. In a preferred embodiment, these electrical connections can include power over ethernet (POE), RS232, Power input, radio frequency antenna connection, or other electrical connections known in the art and capable of transmitting necessary video signals and control to the communications center.

Figure 15:
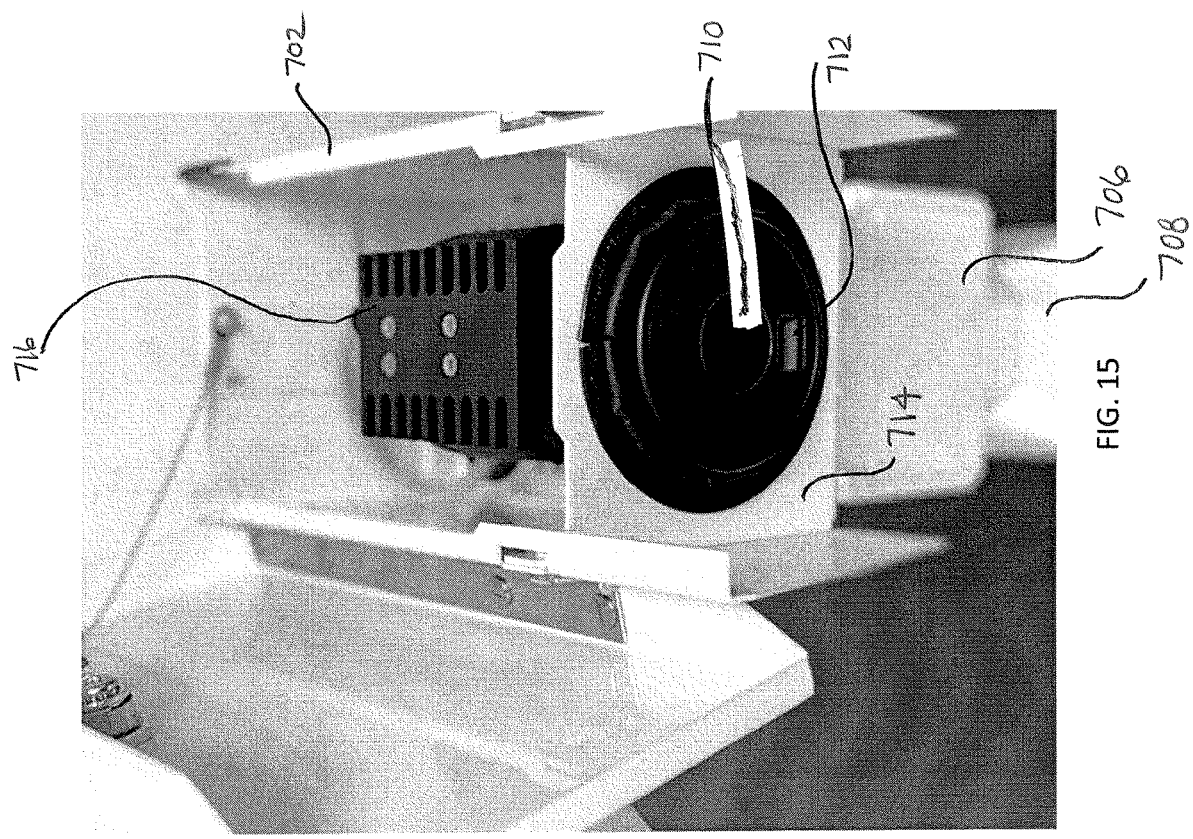
FIG. 15 is a front upper view of the imaging system of FIG. 14 with the lid open and showing the placement of the heat sink above the camera and the relative mounting positions of the chassis to the PTZ and base.
Figure 14:
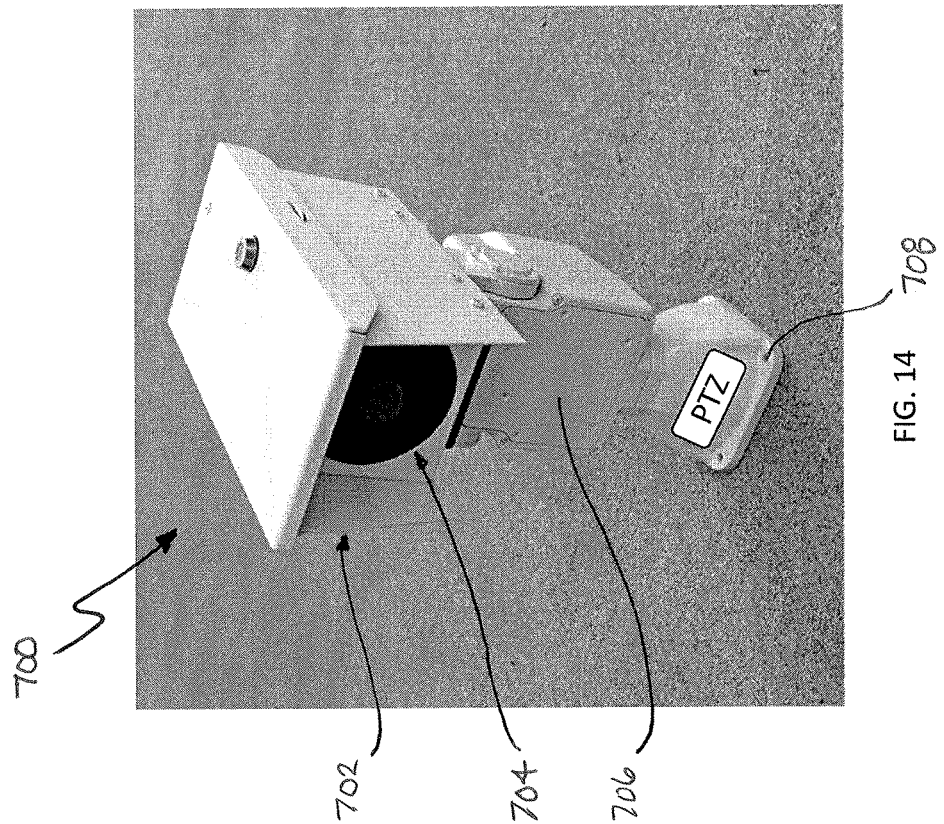
FIG. 14 is a preferred embodiment of the imaging system of the Real-Time Fault Detection and Infrared Inspection System of the present invention showing the chassis with the camera mounted to a PTZ mount and a base mounting bracket.
Figure 17:
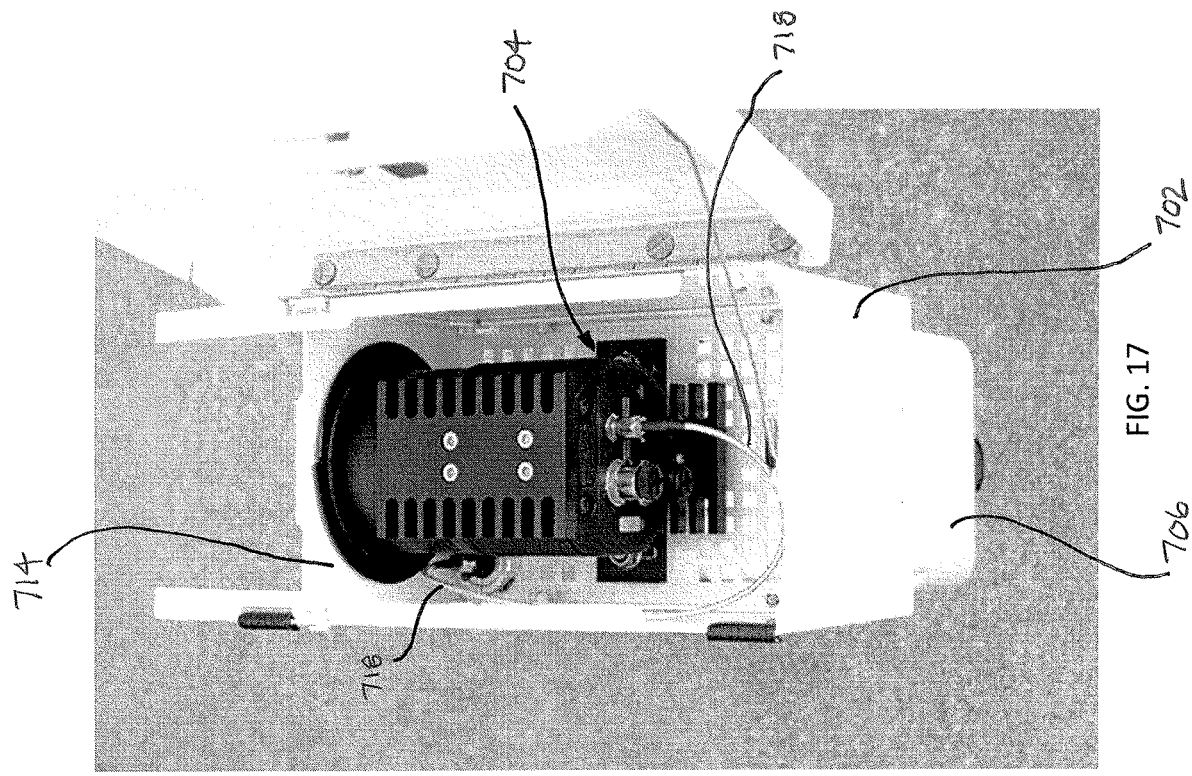
FIG. 17 is a back upper view again showing the placement of the antenna interface cable from the camera to the antenna.
Figure 16:
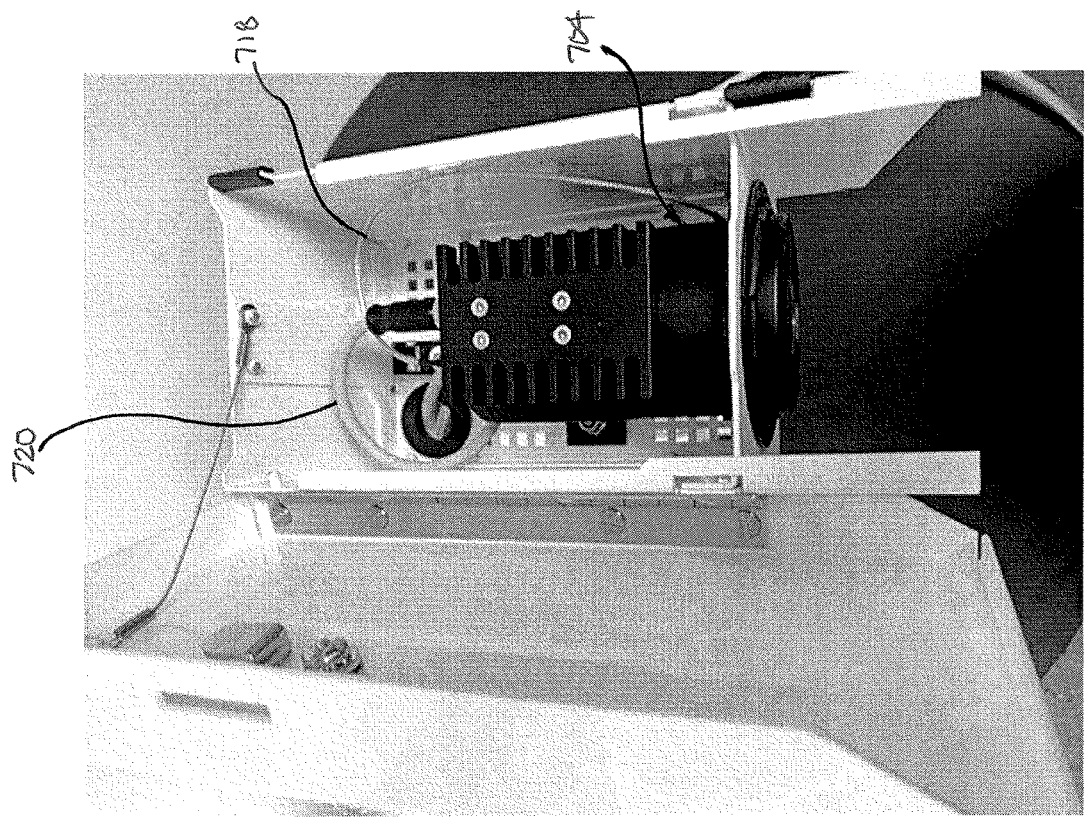
FIG. 16 is a back upper view of the imaging system of FIG. 14 with the lid open and showing the placement of the antenna interface cable and video output cable passing through the cable access port.
Figure 18:
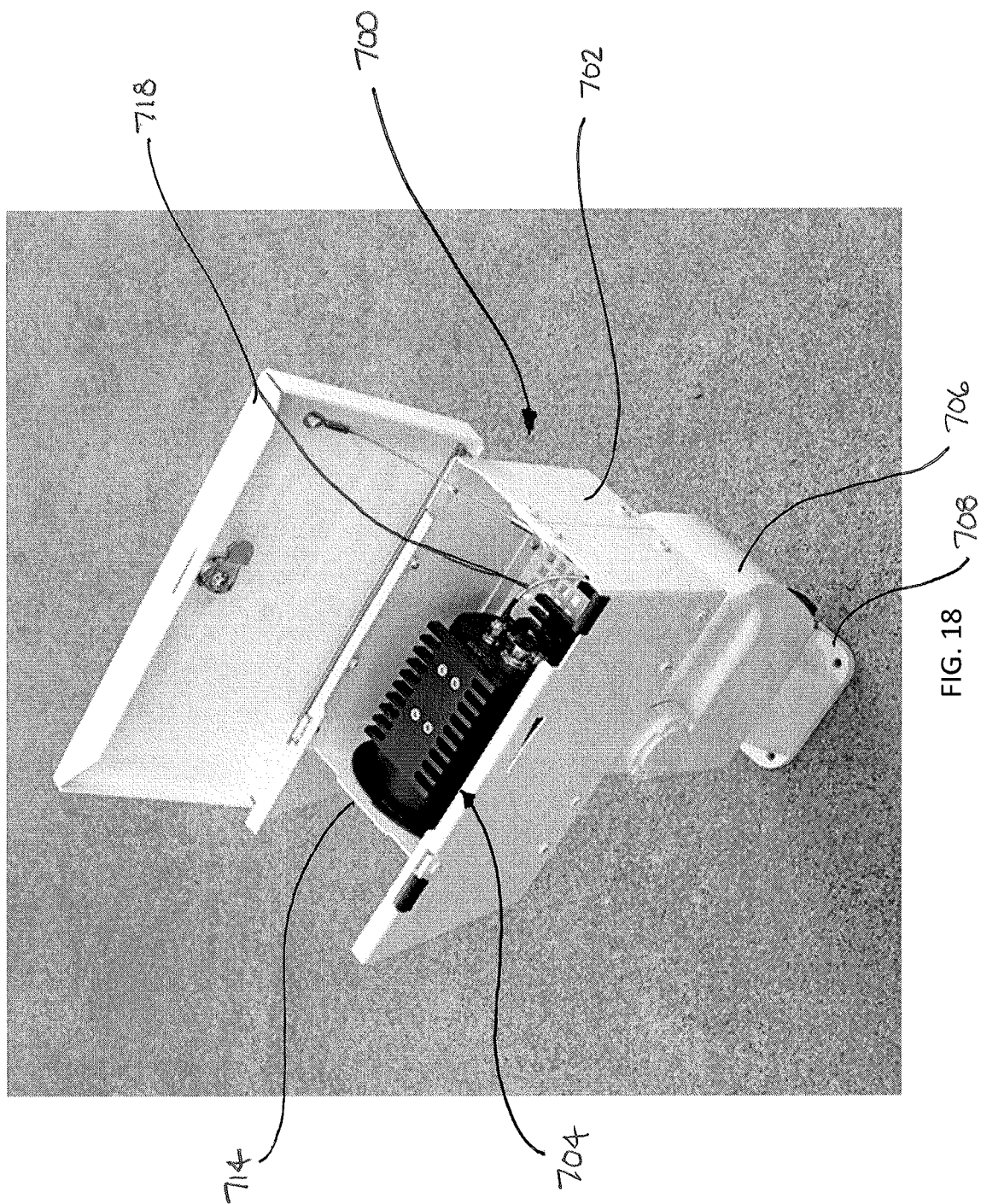
FIG. 18 is a back upper view of the imaging system of the Real-Time Fault Detection and Infrared Inspection System of the present invention showing the chassis mounted to the PTZ mount and base ready for installation.

FIG. 14 is a preferred embodiment of the imaging system 700 of the Real-Time Fault Detection and Infrared Inspection System 400 of the present invention showing the chassis 702 with the camera 704 mounted to a PTZ mount 706 and a base mounting bracket 708. FIG. 15 shows a front upper view of the imaging system of FIG. 14 with the lid open and showing the placement of the heat sink 716 above the camera and the relative mounting positions of the chassis to the PTZ 706 and base 708.

Figure 11:
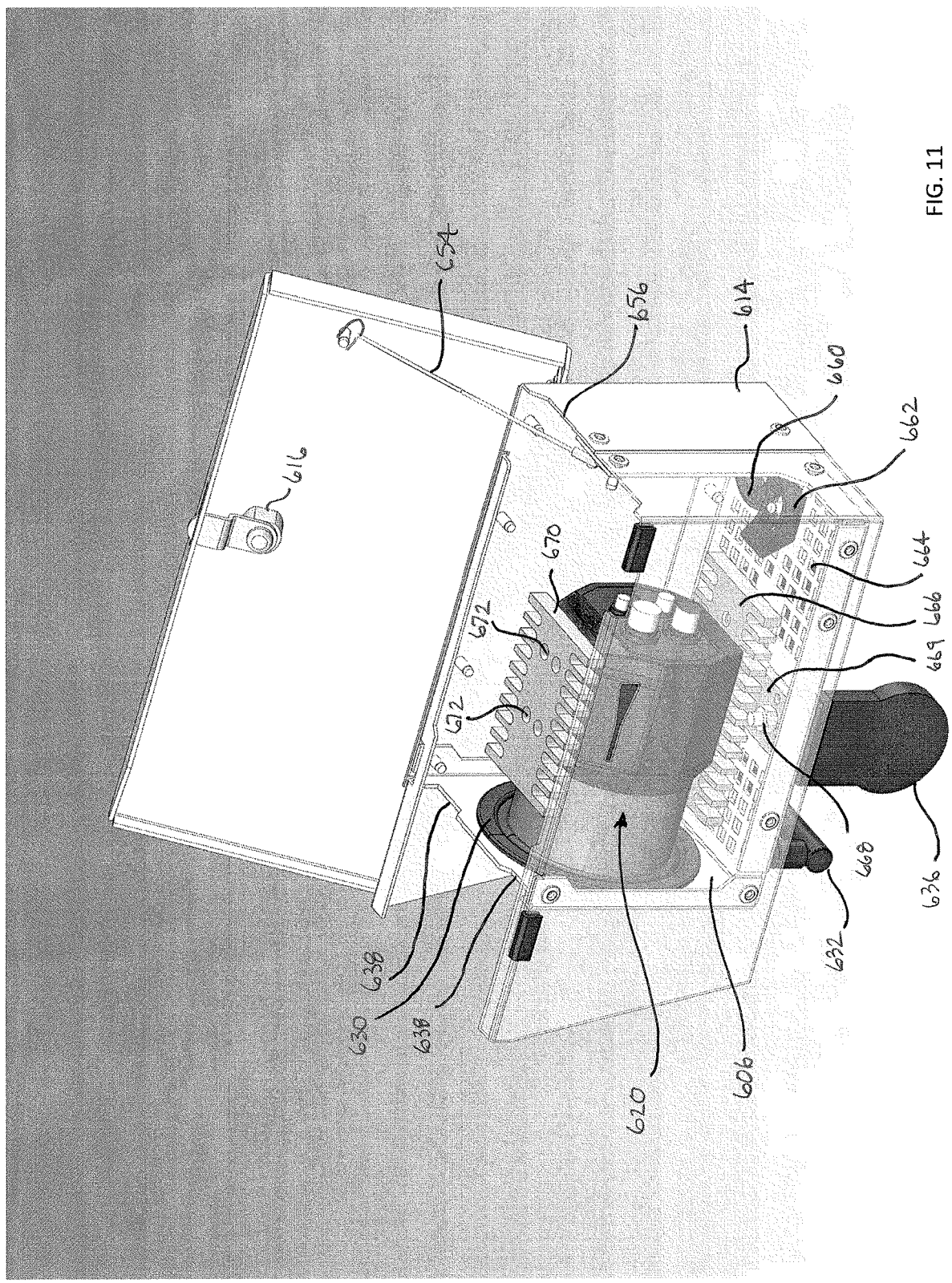
FIG. 11 is a back right side view of the imaging system of the Real-Time Fault Detection and Infrared Inspection System of the present invention showing the rear of the camera and the cabling fasteners and access port, along with the upper and lower heat sinks used to distribute the heat from the camera.

FIGS. 15, 16, 17 and 18 are internal views of the imaging system of FIG. 14 with the lid open and showing the placement of the antenna interface cable 718 and video output cable 720 passing through the cable access port (not shown in this figure, see 660 shown in FIG. 11). Also, the position of infrared imaging device 712 and visual imaging device 710 on front panel 714 is shown.

Figure 19:
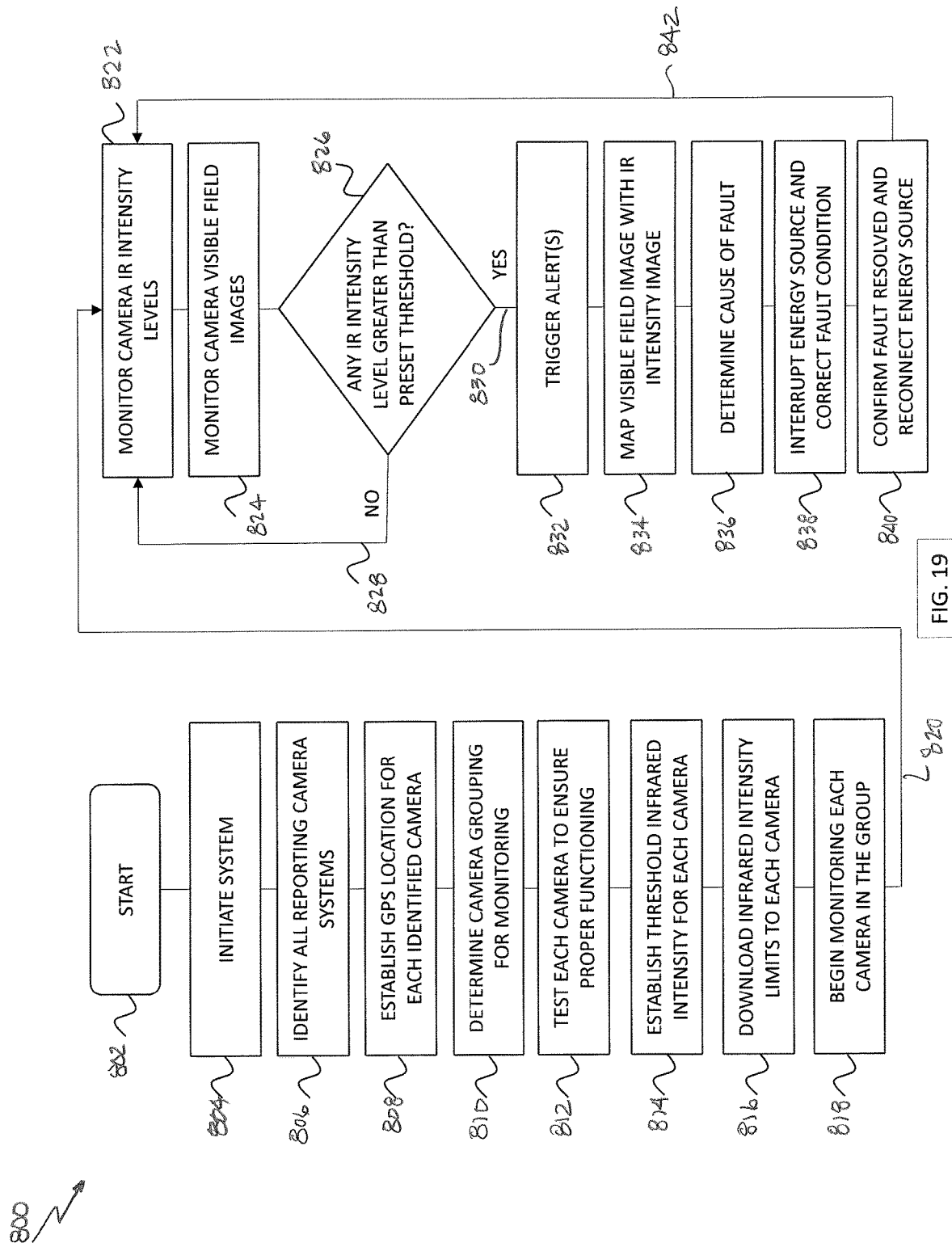
FIG. 19 is a flow chart depicting the method steps by which the Real-Time Fault Detection and Infrared Inspection System of the present invention is initiated, configured with preset fault condition limits, and then continuously monitors the electrical transmission lines to ensure proper, safe, and reliable operation, and if a fault occurs, provides an immediate alert, diagnoses the fault, and interrupts the circuit to prevent further damage.

Referring now to FIG. 19, a flow chart 800 depicting the method steps by which the Real-Time Fault Detection and Infrared Inspection System of the present invention is shown. The steps begin in step 802 with a start and the system is initiated in step 804. Each camera is identified in step 806 and a GPS location is determined in step 808. Collective grouping is made in step 810 for monitoring purposes, each camera is tested in step 812, and a threshold infrared limit is established in 814. The preset infrared limit is downloaded to each camera in step 816, and each camera begins monitoring in step 818.

The cameras continue to monitor infrared intensity in step 822, and visual imaging is monitored in step 824. If no infrared intensity level is higher than the preset limit, the method returns on path 828 to continue monitoring the cameras. However, if a high condition is measured in step 826, alerts are triggered in step 832, the visual field is mapped with the infrared field to combine an image for operator viewing in step 834, and the cause of the fault is determined in step 836. If necessary, the energy source is interrupted in step 838, and once the fault is resolved, the energy source can be reconnected to the system in step 840. Once reconnected, monitoring continues in path 842 to step 822.

While there have been shown what are presently considered to be preferred embodiments of the present invention, it will be apparent to those skilled in the art that various changes and modifications can be made herein without departing from the scope and spirit of the invention.

I claim:

1. A real-time monitoring system for high-voltage electrical transmission lines comprising:
    a fixed imaging system comprising a chassis, a camera having a visual imaging device and an infrared imaging device, the camera located between two heat sinks, the heat sinks comprising a first heat sink located above said camera and a second heat sink located on a base of said chassis below said camera, vents on said base of said chassis, and a pan, tilt, and zoom (PTZ) mount located below and attached to said chassis;
    a communication center configured to receive input from said fixed imaging system;
    a communication link, said communication link transferring input from said fixed imaging system to said communication center;
    a control center communicating bidirectionally with said fixed imaging system;
    a bidirectional link, said bidirectional link placed between said communication center and said control center to facilitate said bidirectional communication between said control center and said fixed imaging system; and,
    a portable imaging system cooperating with said fixed imaging system; said portable imaging system capable of communicating through said communication link to said communication center and communicating bidirectionally through said bidirectional link to said control center,
    wherein a preset infrared limit is downloaded to said portable imaging system and said fixed imaging system,
    wherein the control center comprises a monitoring station configured to display a graph of infrared intensity against time with a time cursor and a threshold cursor against said graph, said time cursor engageable for movement to pan through recorded video and said threshold cursor engageable for movement to adjust an infrared threshold limit,
    wherein said movement of said time cursor consists of movement along the time axis of said graph, and
    wherein said movement of said threshold cursor consists of movement along the intensity axis of said graph.

2. The real-time monitoring system for high-voltage electrical transmission lines of claim 1, wherein said portable imaging system is a vehicle-mounted imaging system.

3. The real-time monitoring system for high-voltage electrical transmission lines of claim 1, wherein said fixed imaging system further comprises a bellows and a sealing ring extending from a front side of said camera to a front panel of said chassis and configured to provide sealed alignment of said camera in said chassis.

4. The real-time monitoring system for high-voltage electrical transmission lines of claim 1, wherein said fixed imaging system further comprises a wiring aperture on said base of the chassis and a wire tie bracket located within said chassis and next to said wiring aperture.

5. The real-time monitoring system for high-voltage electrical transmission lines portable imaging system of claim 4, further comprising an antenna to provide wireless communication with said control center.

6. The real-time monitoring system for high-voltage electrical transmission lines of claim 1, wherein said control center comprises a control room housing said monitoring station, said monitoring station receiving input from said control room through a monitoring station communication link.

7. The real-time monitoring system for high-voltage electrical transmission lines of claim 6, wherein said monitoring station displays a visual image field and an infrared image field separately.

8. The real-time monitoring system for high-voltage electrical transmission lines of claim 6, wherein said monitoring station superimposes a visual image field over an infrared image field.

9. The real-time monitoring system for high-voltage electrical transmission lines of claim 1, wherein said communication link is a wired connection.

10. The real-time monitoring system for high-voltage electrical transmission lines of claim 1, wherein said communication link is a wireless connection that interfaces with a digital cloud.

11. The real-time monitoring system for high-voltage electrical transmission lines of claim 1, wherein said fixed imaging system further comprises a lid on said chassis and having a hinge attaching said lid to a first side of said chassis, a drip edge on said lid, upper vents proximate said lid, pads on a second side of said chassis opposite said hinge and configured to prevent rattling, and GPS receivers.

* * * * *